(12) United States Patent
Shmarev et al.

(10) Patent No.: US 10,754,259 B2
(45) Date of Patent: Aug. 25, 2020

(54) METHOD AND DEVICE FOR PUPIL ILLUMINATION IN OVERLAY AND CRITICAL DIMENSION SENSORS

(71) Applicants: ASML Holding N.V., Veldhoven (NL); ASML Netherlands B.V., Veldhoven (NL)

(72) Inventors: Yevgeniy Konstantinovich Shmarev, Lagrangeville, NY (US); Markus Franciscus Antonius Eurlings, Tilburg (NL)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 27 days.

(21) Appl. No.: 16/313,816

(22) PCT Filed: Jun. 16, 2017

(86) PCT No.: PCT/EP2017/064734
§ 371 (c)(1),
(2) Date: Dec. 27, 2018

(87) PCT Pub. No.: WO2018/001751
PCT Pub. Date: Jan. 4, 2018

(65) Prior Publication Data
US 2019/0155172 A1  May 23, 2019

Related U.S. Application Data

(60) Provisional application No. 62/357,108, filed on Jun. 30, 2016.

(51) Int. Cl.
*G03F 7/20* (2006.01)
*G01N 21/956* (2006.01)
(Continued)

(52) U.S. Cl.
CPC ......... *G03F 7/70625* (2013.01); *G01N 21/47* (2013.01); *G01N 21/956* (2013.01);
(Continued)

(58) Field of Classification Search
CPC ............. G03F 7/70625; G03F 7/70633; G03F 7/70833; G01N 21/47; G01N 21/956; G02B 26/0833; G02B 27/283; G02B 5/005
See application file for complete search history.

(56) References Cited

U.S. PATENT DOCUMENTS 6,487,014 B2 * 11/2002 Li ...................... G02B 6/29302
 348/E9.027
7,116,425 B2 * 10/2006 Hanson ................ G03H 1/0406
 356/457
(Continued)

FOREIGN PATENT DOCUMENTS

CN 101251718 A 8/2008
CN 105629454 A 6/2016
(Continued)

OTHER PUBLICATIONS

International Preliminary Report on Patentability directed to related International Patent Application No. PCT/EP2017/064734, dated Jan. 1, 2019; 7 pages.
(Continued)

*Primary Examiner* — Dominic J Bologna
(74) *Attorney, Agent, or Firm* — Sterne, Kessler, Goldstein & Fox P.L.L.C.

(57) ABSTRACT

An illumination system for a metrology apparatus that can achieve illumination spatial profile flexibility, high polarization extinction ratio, and high contrast. The illumination system includes a polarizing beam splitter (PBS), an illumination mode selector (IMS), and a reflective spatial light
(Continued)

modulator (SLM). The PBS divides an illumination beam into sub-beams. The IMS has a plurality of apertures that transmits at least one sub-beam and may be arranged in multiple illumination positions corresponding to illumination modes. A pixel array of the reflective SLM and reflects a portion of the sub-beam transmitted by the IMS back to the IMS and PBS. The PBS, IMS, SLM collectively generates a complex amplitude or intensity spatial profile of the transmitted sub-beam.

24 Claims, 10 Drawing Sheets

(51) Int. Cl.
    *G01N 21/47*     (2006.01)
    *G02B 26/08*     (2006.01)
    *G02B 27/28*     (2006.01)
    *G02B 5/00*     (2006.01)

(52) U.S. Cl.
    CPC .......... *G03F 7/70633* (2013.01); *G02B 5/005* (2013.01); *G02B 26/0833* (2013.01); *G02B 27/283* (2013.01)

(56) References Cited

U.S. PATENT DOCUMENTS

| | | | |
|---|---|---|---|
| 7,839,506 | B2 | 11/2010 | Straaijer et al. |
| 9,069,264 | B2 | 6/2015 | Warnaar et al. |
| 9,557,856 | B2 | 1/2017 | Send et al. |
| 9,857,599 | B2 | 1/2018 | Tanitsu |
| 2003/0011760 | A1 | 1/2003 | Vaez-Iravani et al. |
| 2004/0033426 | A1* | 2/2004 | Den Boef .............. G03B 27/32 430/22 |
| 2010/0328655 | A1 | 12/2010 | Den Boef |
| 2011/0027704 | A1 | 2/2011 | Cramer et al. |
| 2011/0043791 | A1 | 2/2011 | Smilde et al. |
| 2011/0069292 | A1 | 3/2011 | Den Boef |
| 2011/0069312 | A1 | 3/2011 | Kandel et al. |
| 2012/0044470 | A1 | 2/2012 | Smilde et al. |
| 2012/0123581 | A1 | 5/2012 | Smilde et al. |
| 2012/0202157 | A1 | 8/2012 | Tanitsu |
| 2012/0206729 | A1* | 8/2012 | Seligson ............. G03F 7/70633 356/445 |
| 2013/0027140 | A1 | 1/2013 | Poppe et al. |
| 2013/0050501 | A1 | 2/2013 | Warnaar et al. |
| 2013/0141730 | A1 | 6/2013 | Quintanilha |
| 2013/0258310 | A1 | 10/2013 | Smilde et al. |
| 2014/0374981 | A1 | 12/2014 | Ishikawa et al. |
| 2015/0042999 | A1 | 2/2015 | Quintanilha |
| 2015/0286340 | A1* | 10/2015 | Send ....................... G01S 5/163 345/175 |
| 2016/0025992 | A1* | 1/2016 | Van Der Zouw ........................... G01N 21/8806 250/216 |
| 2016/0091422 | A1* | 3/2016 | Van Der Zouw ........................... G01N 21/4738 356/445 |
| 2016/0370710 | A1 | 12/2016 | Wardenier et al. |
| 2017/0168312 | A1* | 6/2017 | Kelkar ................ G03F 7/70133 |
| 2018/0321597 | A1* | 11/2018 | Javaheri ................ G01M 11/00 |

FOREIGN PATENT DOCUMENTS

| | | |
|---|---|---|
| JP | 2009-105396 A | 5/2009 |
| JP | 2014-529896 A | 11/2014 |
| JP | 2016-537638 A | 12/2016 |
| JP | 2019-500600 A | 1/2019 |
| WO | WO 2009/078708 A1 | 6/2009 |
| WO | WO 2009/106279 A1 | 9/2009 |
| WO | WO 2010/089458 A1 | 8/2010 |

OTHER PUBLICATIONS

International Search Report and Written Opinion of the International Searching Authority directed to related International Patent Application No. PCT/EP2017/064734, dated Sep. 4, 2017; 9 pages.

Chinese Search Report with English-language translation attached directed to related Chinese Patent Application Publication No. 2017800412249, dated Jun. 12, 2020; 4 pages.

\* cited by examiner

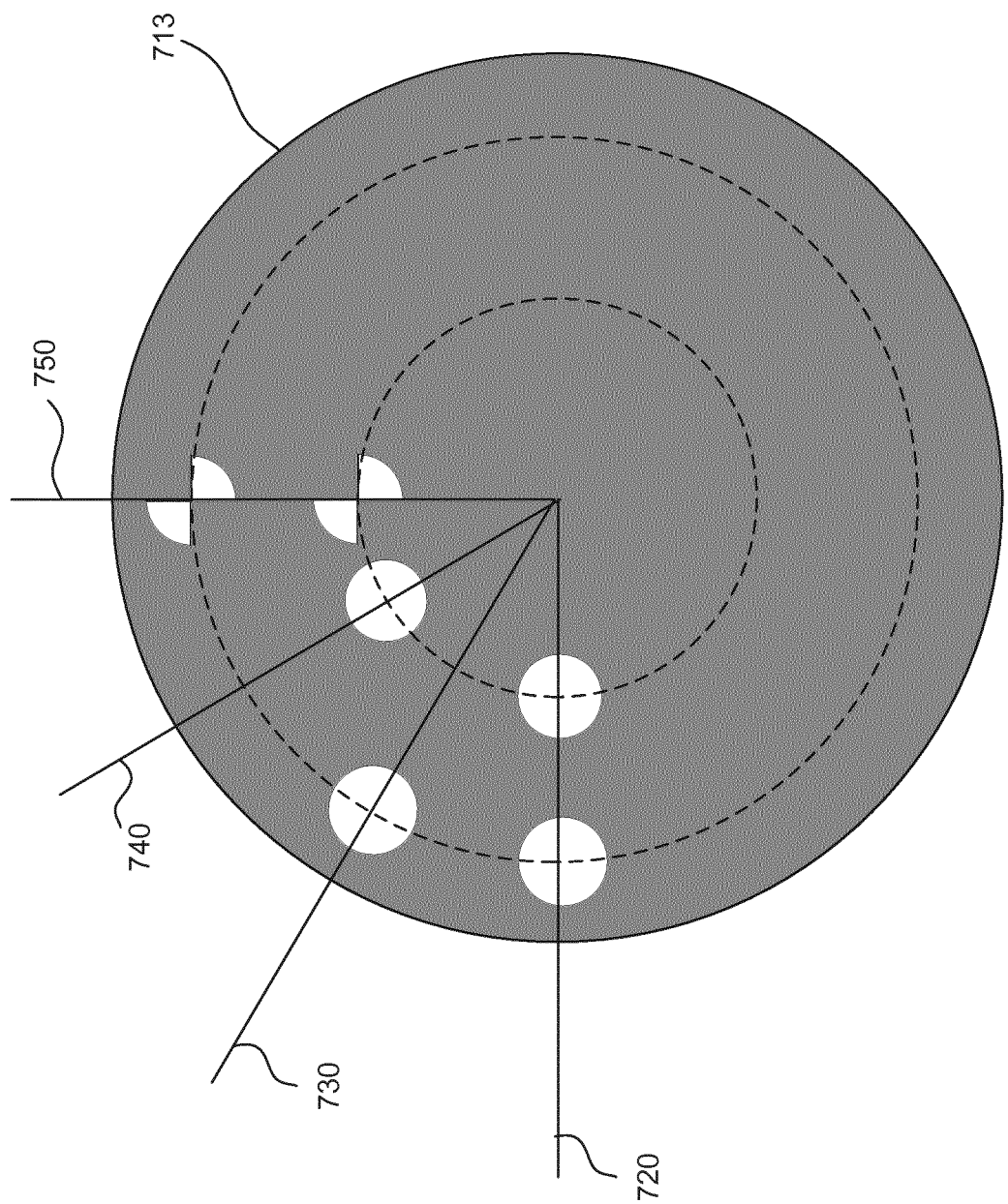

METHOD AND DEVICE FOR PUPIL ILLUMINATION IN OVERLAY AND CRITICAL DIMENSION SENSORS

CROSS-REFERENCE TO RELATED APPLICATIONS

This application claims priority of U.S. Provisional Patent Application No. 62/357,108, which was filed on Jun. 30, 2016, and which is incorporated herein in its entirety by reference.

FIELD

The present disclosure relates methods and apparatus for semiconductor wafer metrology, for example, in the manufacture of devices by lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In a lithographic process (i.e., a process of developing a device or other structure involving lithographic exposure, which may typically include one or more associated processing steps such as development of resist, etching, etc.), it is desirable frequently to make measurements of the structures created, e.g., for process control and verification. Various tools for making such measurements are known, including scanning electron microscopes (SEM), which are often used to measure critical dimension (CD), and specialized tools to measure overlay (OV) (i.e., the accuracy of alignment of two layers in a device). Recently, various forms of scatterometers have been developed for use in the lithographic field. These devices direct a beam of radiation onto a target and measure one or more properties of the scattered radiation—e.g., intensity at a single angle or a range of angles of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis.

Fabrication tolerances continue to tighten as semiconductor devices become ever smaller and more elaborate. Hence, there is a need to continue to improve metrology measurements. One exemplary use of scatterometers is for critical dimension (CD) metrology, which is particularly useful for measuring in patterned structures, such as semiconductor wafers. Optical CD metrology techniques include on dome scatterometry, spectral reflectometry, and spectral ellipsometry. All these techniques are based on measuring the reflected intensity of differently polarized light for different incident directions. Such techniques require a high extinction ratio, or purity of polarization. A polarizing beamsplitter (PBS) divides light by polarization state to transmit p-polarized light while reflecting s-polarized light. Though a perfect PBS transmits 100% of the p-polarization and reflects 100% s-polarization, a real PBS transmits and reflects mixtures of s-polarized light and p-polarized light. The ratio between the p-polarized light and s-polarized light is called the extinction ratio. Optical CD requires a high extinction ratio.

Another exemplary use of scatterometers is for overlay (OV) metrology, which is useful for measuring alignment of a stack of layers on a wafer. In order to control the lithographic process to place device features accurately on the substrate, alignment marks, or targets, are generally provided on the substrate, and the lithographic apparatus includes one or more alignment systems by which positions of marks on a substrate must be measured accurately. In one known technique, the scatterometer measures diffracted light from targets on the wafer. Diffraction-based overlay using "dark field" scatterometry blocks the zeroth order of diffraction (corresponding to a specular reflection), and processes only one or more higher orders of diffraction to create a gray scale image of the target. Diffraction-based overlay using this dark field technique enables overlay measurements on smaller targets, and is known as micro-diffraction-based overlay (µDBO). µDBO, however, requires a very high contrast ratio.

Each product and process requires care in the design of metrology targets and the selection of an appropriate metrology 'recipe' by which overlay measurements will be performed. In a known metrology technique, diffraction patterns and/or dark field images of a metrology target are captured while the target is illuminated under desired illumination conditions. These illumination conditions are defined in the metrology recipe by various illumination parameters such as the wavelength of the radiation, its angular intensity distribution (illumination profile) and its polarization. The inspection apparatus includes an illumination system comprising one or more radiation sources and an illumination system for the delivery of the illumination with the desired illumination parameters. In practice, it will be desired that the illumination system can switch between different modes of illumination by changing these parameters between measurements.

Illumination profiles can be varied greatly and the use of custom illumination is becoming more and more important in optical metrology. The customization of the illumination enables improvement of the measurement quality. To customize the intensity across a pupil plane, aperture plates provide a certain measure of control in matching the mode of illumination to the metrology techniques. A filter wheel including a plurality of different apertures may be used to select a particular illumination mode. The filter wheel, however, is finite in size and, thus, can only accommodate a limited number of different apertures. In addition, the apertures on a filter wheel are static and, thus, do not allow adjustment of the individual apertures. Alternative approaches, such as using spatial light modulators (SLM) can increase flexibility, but have their own limitations. For example, transmissive liquid crystal (LC) SLMs or micro mirror arrays cannot achieve the extreme contrast required for µDBO. Also, known LC SLM arrangements may not provide the high extinction ratio needed for CD metrology.

Further, use of multiple LC SLMs increases cost and complexity and create additional synchronization and calibration issues.

SUMMARY

It is desirable to provide a single, flexible illumination system for a metrology apparatus that can achieve illumination spatial profile flexibility, high polarization extinction ratio, and high contrast.

According to an embodiment, a metrology system includes a polarizing beam splitter (PBS) configured to divide an illumination beam into a first sub-beam and a second sub-beam; an illumination mode selector (IMS) having a plurality of apertures, each aperture configured to transmit either the first sub-beam or the second sub-beam and the IMS configured to be arranged in a plurality of illumination positions, each of the plurality of illumination positions corresponding to an illumination mode; and a reflective spatial light modulator (SLM) having a pixel array, the pixel array being configured to modify a spatially-resolved beam characteristic of the first sub-beam and the second sub-beam and to reflect either or both of the first sub-beam and the second sub-beam back to the IMS and PBS along a return path, wherein, along the return path, the PBS, IMS, and SLM cooperate to control a complex amplitude or intensity spatial profile of at least the first sub-beam or the second sub-beam; an objective projection system configured to receive the first sub-beam and the second sub-beam from the IMS and PBS and direct the first sub-beam and the second sub-beams towards a substrate having a target structure thereon; and a detector configured to receive an image or diffracted image of the target structure.

A method for inspection including splitting, via a polarizing beam splitter (PBS), an illumination beam into a first sub-beam and a second sub-beam; transmitting the either the first sub-beam or the second sub-beam through an aperture of illumination mode selector (IMS), wherein the IMS is arranged in illumination position corresponding to an illumination mode; and generating a desired a complex amplitude or intensity spatial profile of the transmitted first sub-beam or the second sub-beam via a reflective spatial light modulator (SLM) having a pixel array by reflecting a portion of the transmitted first or second sub-beam to the IMS and the PBS; directing, via an objective projection system, the portion of at least the transmitted first sub-beam or the second sub-beam from the IMS and PBS towards a substrate having a target thereon; and detecting an image or diffracted image of the target structure.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 4:
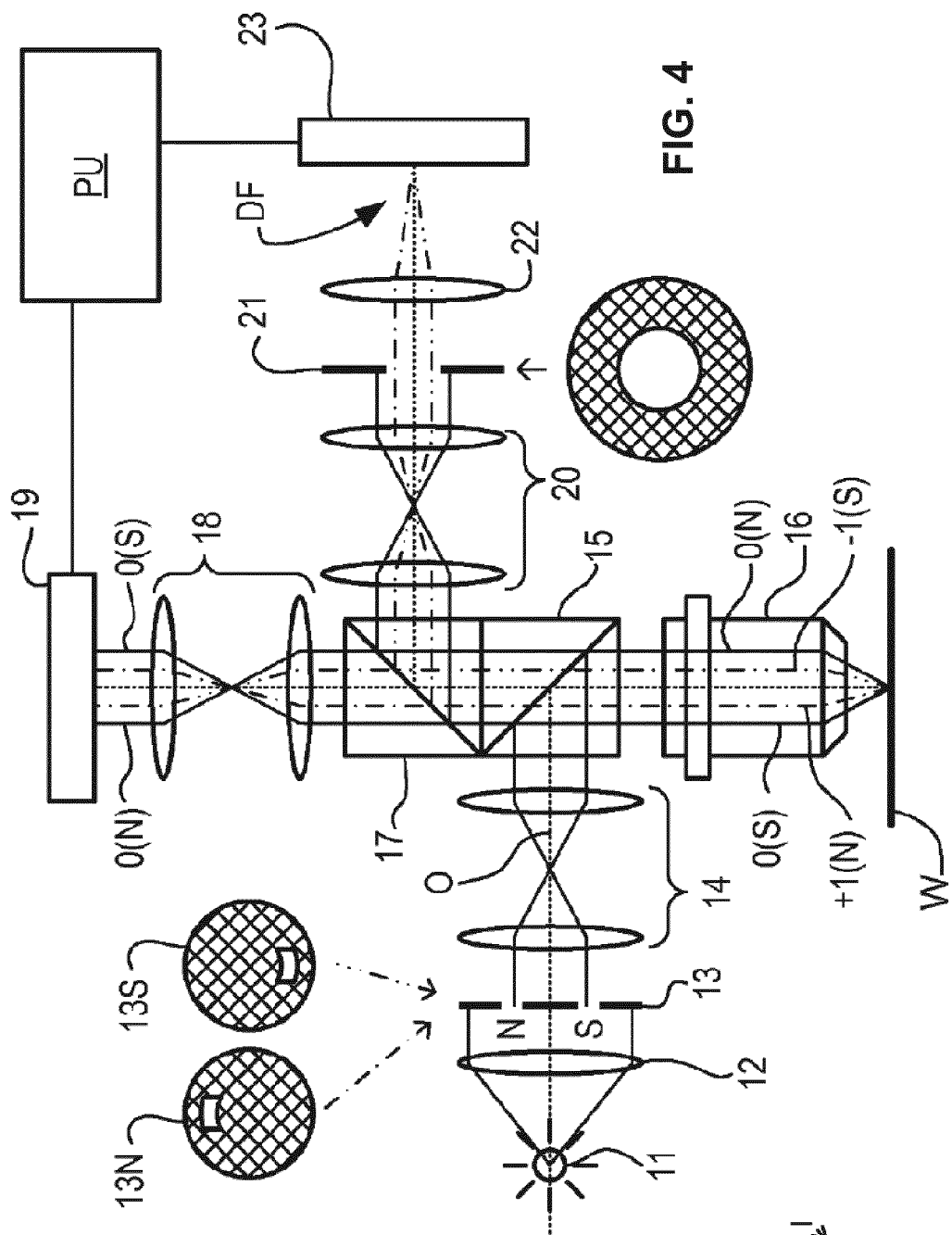

FIG. 4 schematically depicts a dark field measurement apparatus for use in measuring targets, according to an embodiment using a first pair of illumination apertures providing certain illumination modes.

Figure 5:
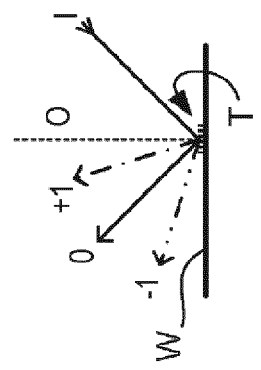

FIG. 5 is a schematic detail of a diffraction spectrum of a target for a given direction of illumination.

Figure 6:
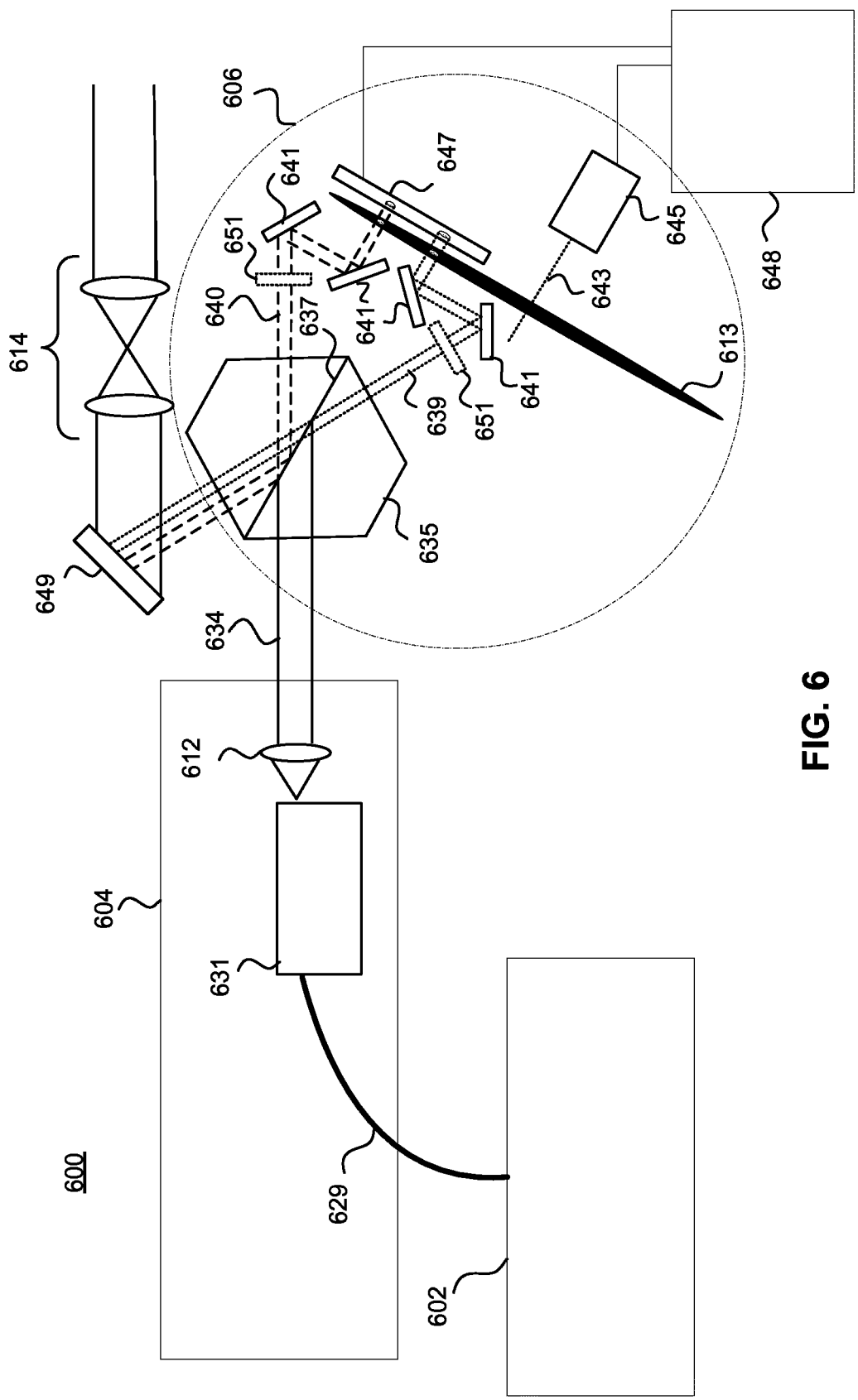

FIG. 6 schematically depicts an illumination system according to an embodiment.

Figure 6A:
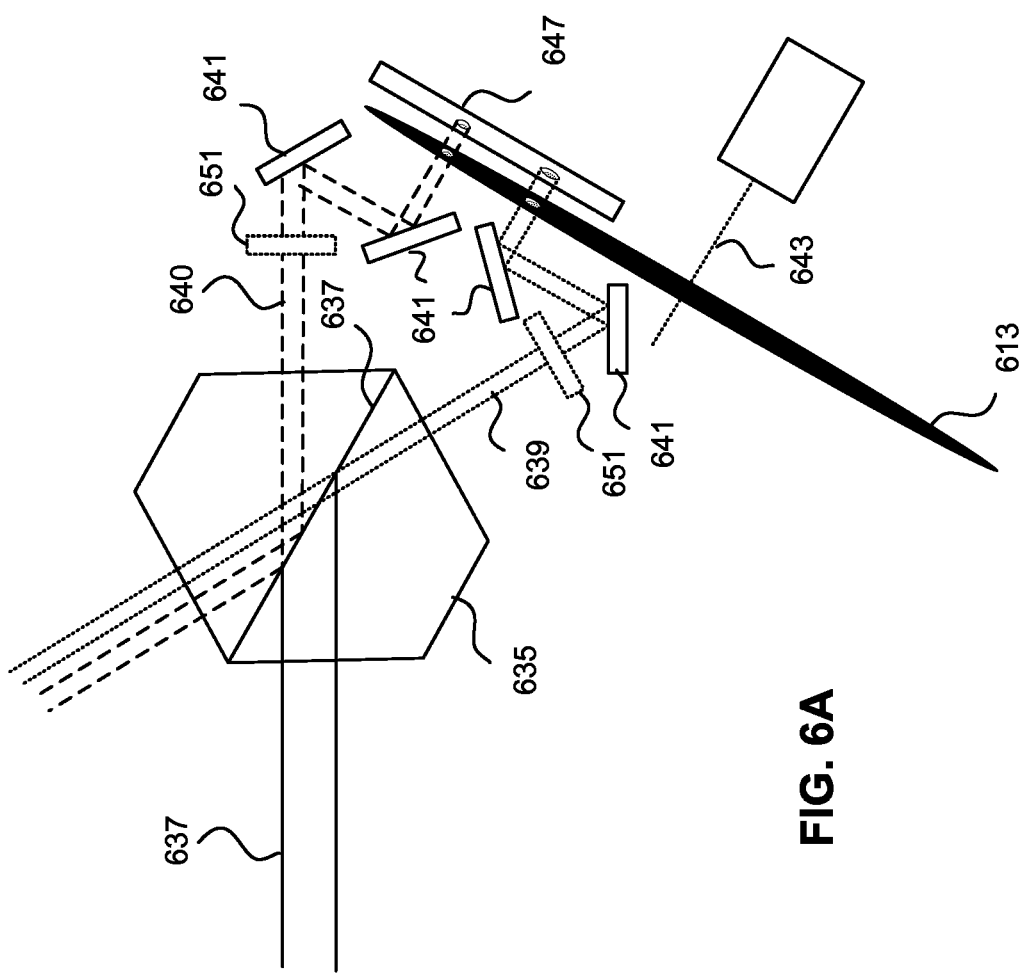

FIG. 6A schematically depicts a portion of the illumination system shown in FIG. 6.

FIG. 7 schematically depicts a illumination mode selector according to an embodiment.

Figure 8A:
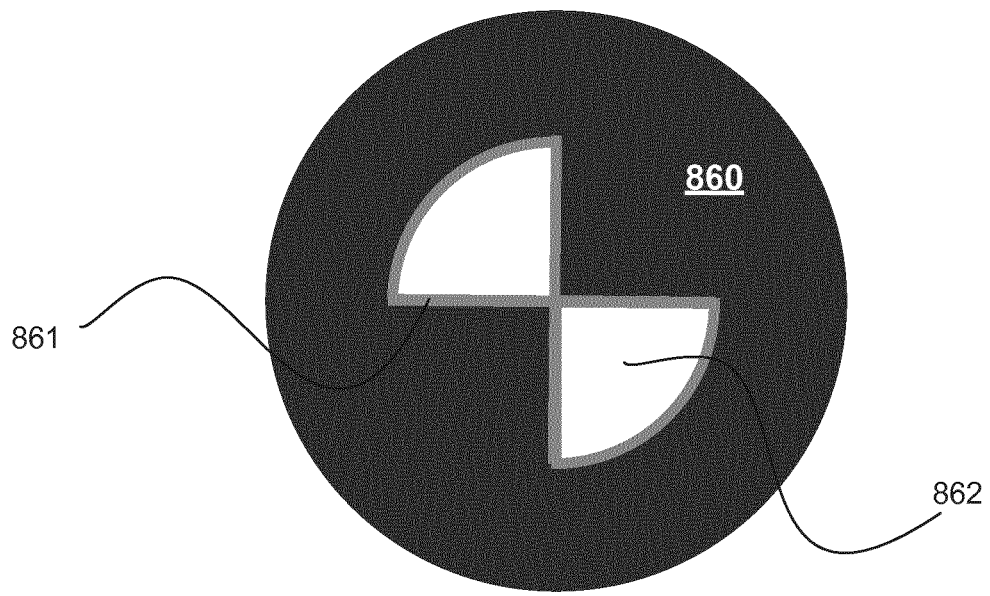

FIG. 8A schematically depicts the combination of a spatial light modulator and a illumination mode selector according to an embodiment.

Figure 8B:
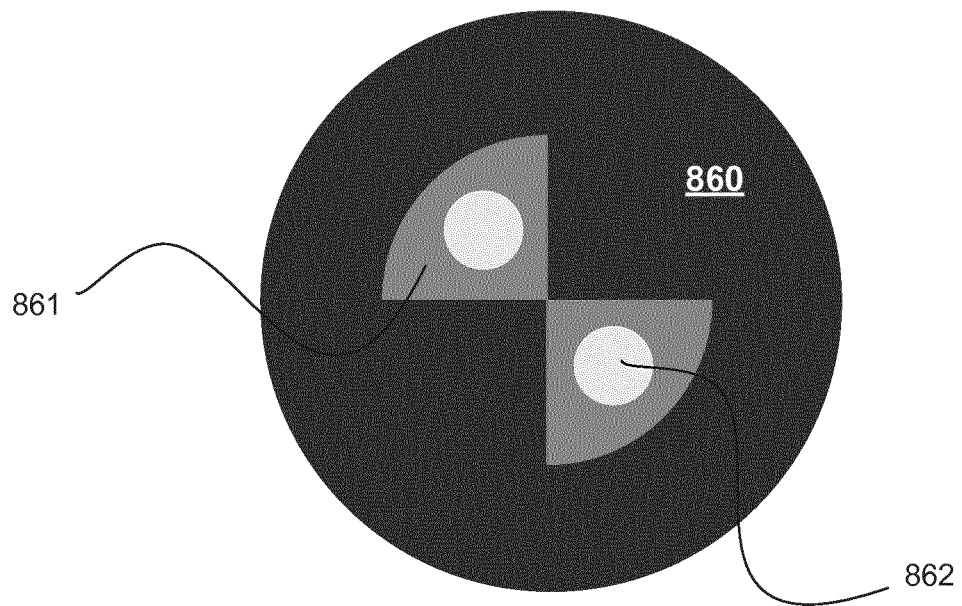

FIG. 8B schematically depicts an alternative arrangement of the combination of a spatial light modulator and a illumination mode selector according to FIG. 8A.

Figure 9:
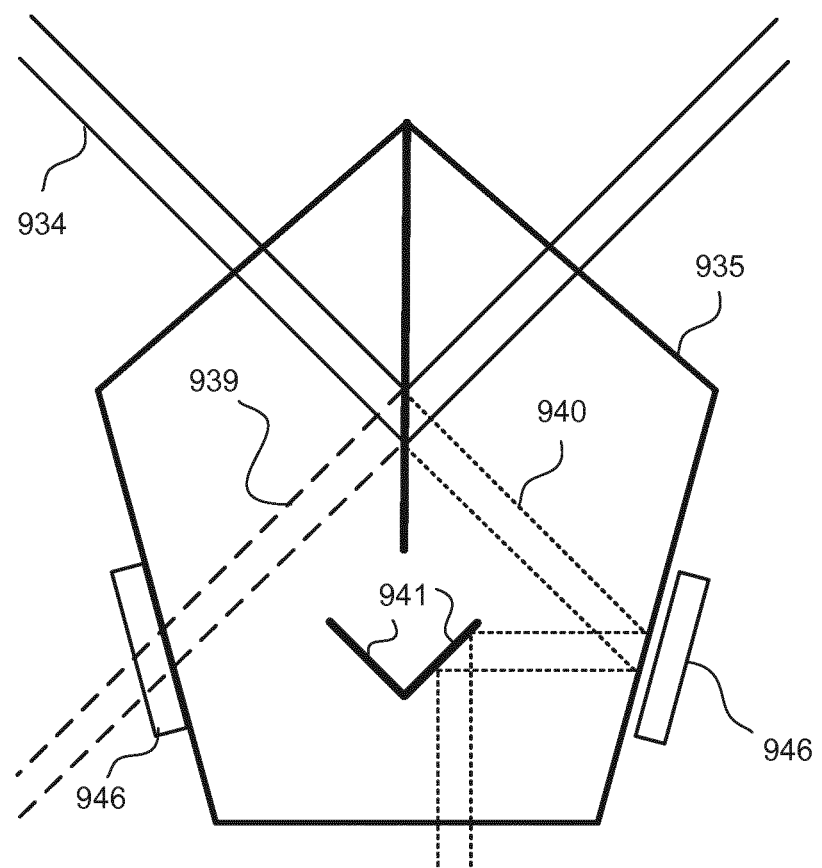

FIG. 9 schematically depicts a monolithic polarizing beam splitter according to an embodiment.

Figure 10:
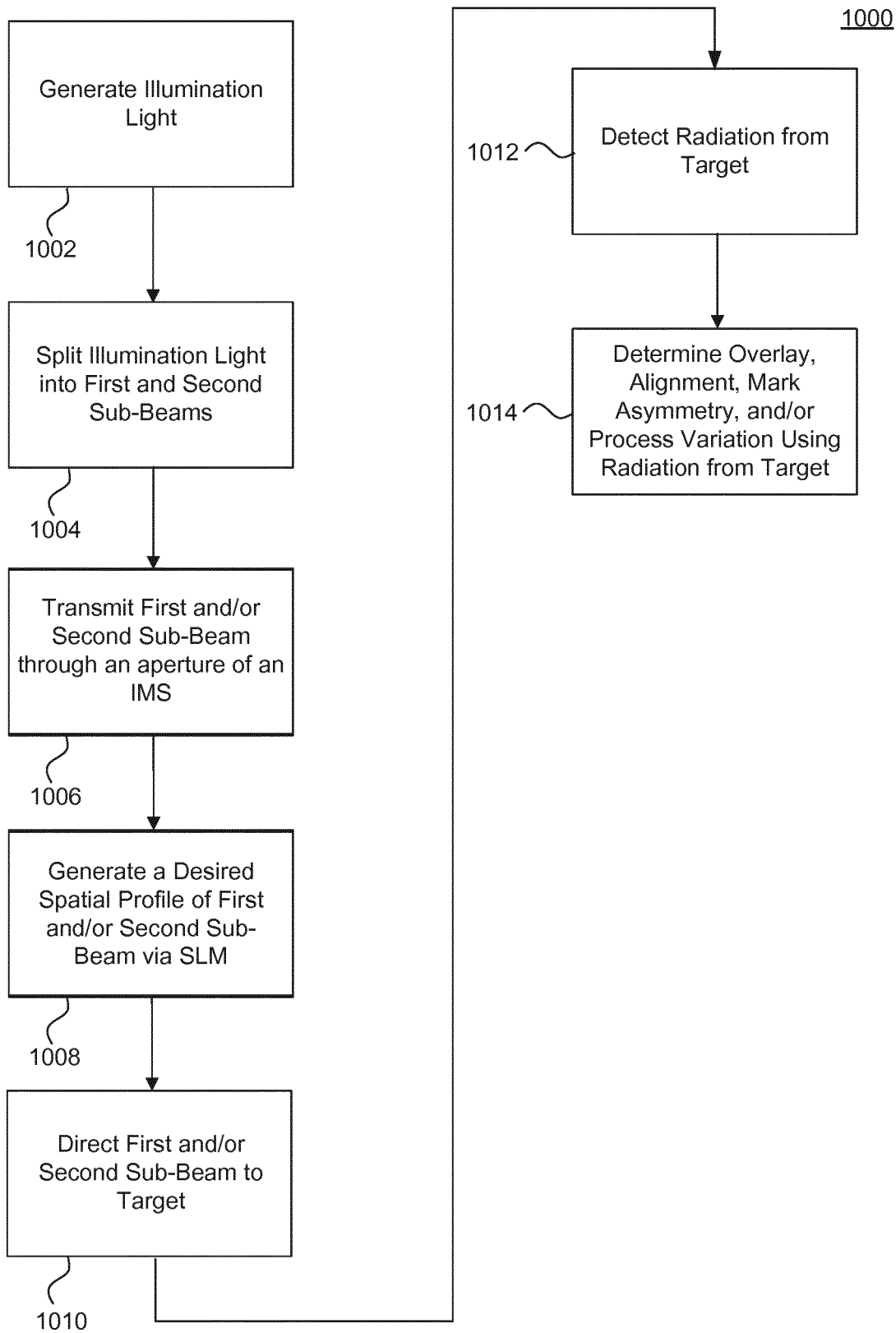

FIG. 10 illustrates a method of inspection according to an embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Example Reflective and Transmissive Lithographic Systems

Figure 1A:
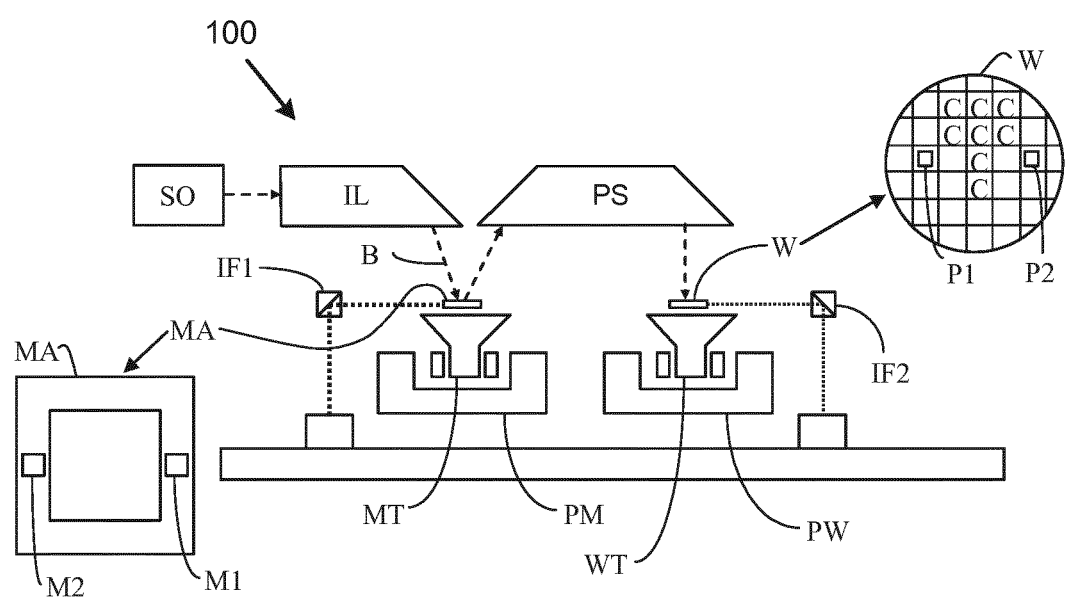
FIG. 1A is a schematic illustration of a reflective lithographic apparatus according to an embodiment.
Figure 1B:
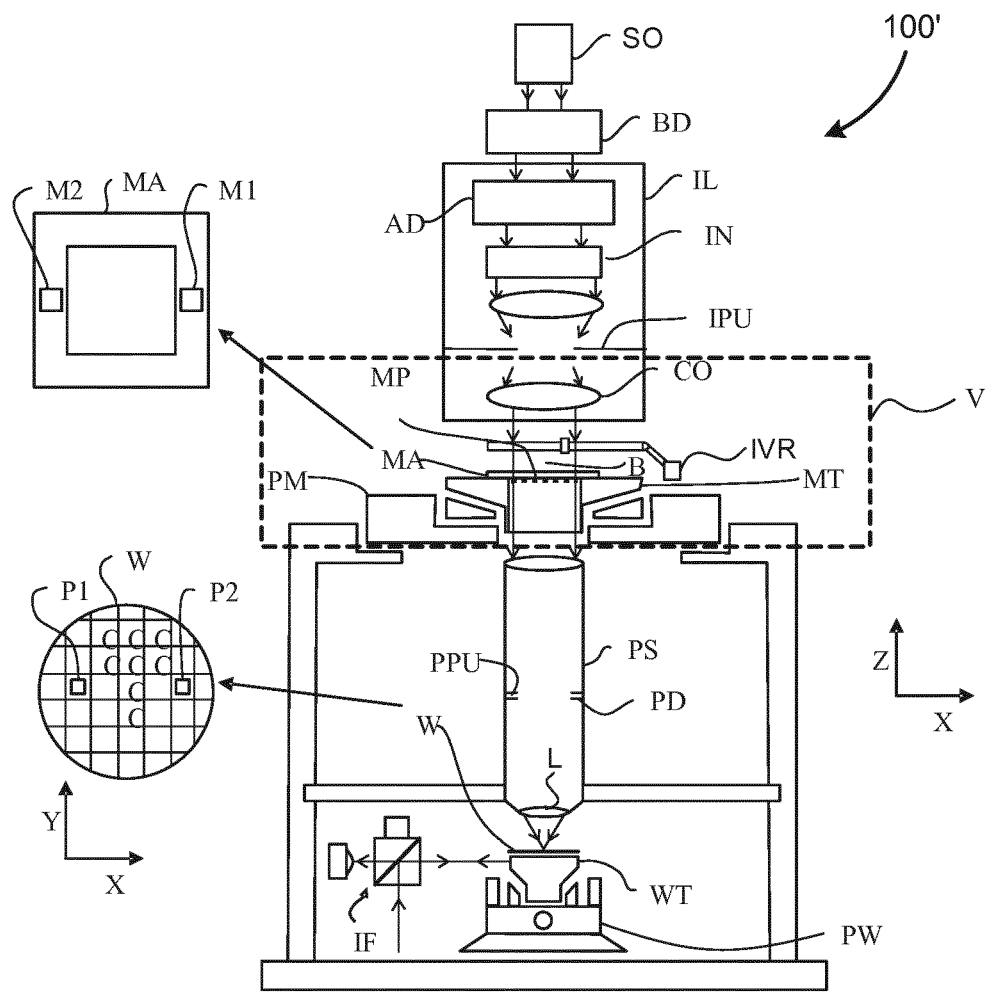
FIG. 1B is a schematic illustration of a transmissive lithographic apparatus according to an embodiment.

FIGS. 1A and 1B are schematic illustrations of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100'— for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern and create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
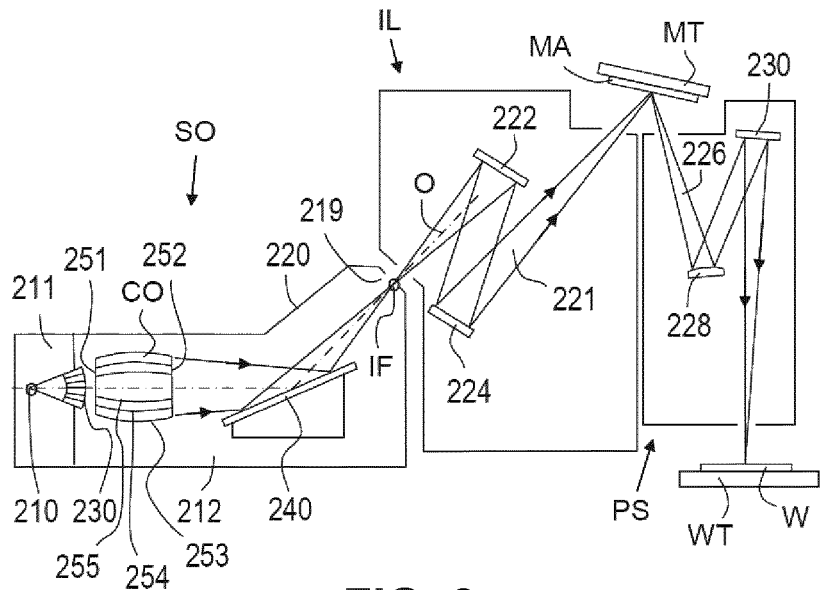
FIG. 2 is a more detailed schematic illustration of the reflective lithographic apparatus, according to an embodiment.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIGs., for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Example Lithographic Cell

Figure 3:
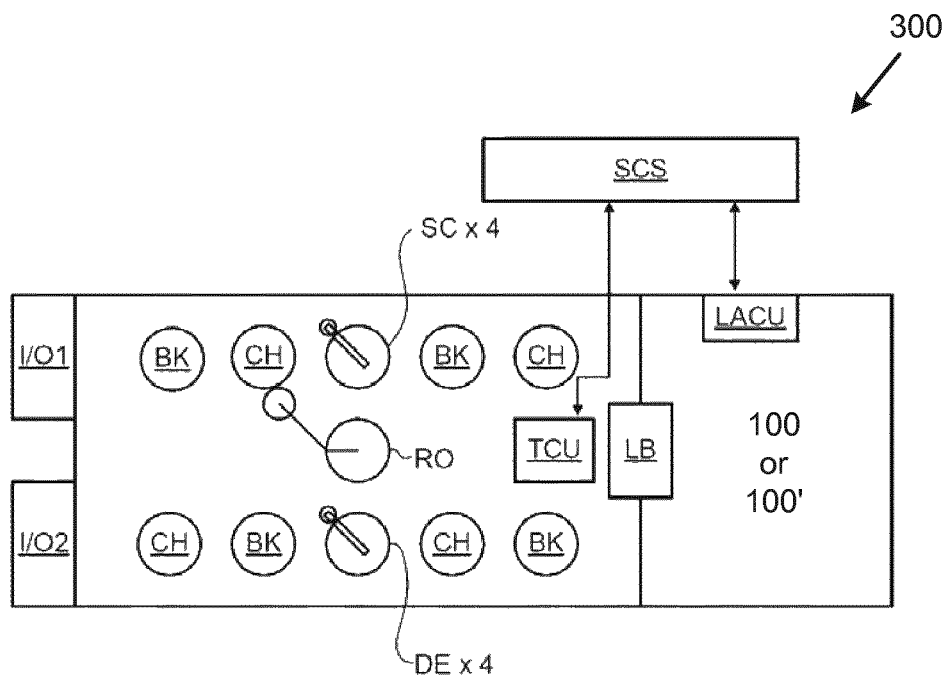
FIG. 3 is a schematic illustration of a lithographic cell, according to an embodiment.

FIG. 3 shows a lithographic cell 300, also sometimes referred to a lithocell or cluster. Lithographic apparatus 100 or 100' may form part of lithographic cell 300. Lithographic cell 300 may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Example Metrology Apparatus

A metrology apparatus suitable for use in embodiments is shown in FIG. 4. A target T (comprising a periodic structure such as a grating) and diffracted rays are illustrated in more detail in FIG. 5. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by a light source 11 (e.g., a source such as a laser or a xenon lamp or an opening connected to a source) is directed onto substrate W via a prism 15 by an optical system comprising lenses 12, 14 and objective lens 16. These lenses are arranged in a double sequence of a 4F arrangement. A different lens arrangement can be used, provided that it still provides a substrate image onto a detector.

In an embodiment, the lens arrangement allows for access of an intermediate pupil-plane for spatial-frequency filtering. Therefore, the angular range at which the radiation is incident on the substrate can be selected by defining a spatial intensity distribution in a plane that presents the angular spectrum of the substrate plane, here referred to as a (conjugate) pupil plane. In particular, this can be done, for example, by inserting an aperture plate 13 of suitable form between lenses 12 and 14, in a plane which is a back-projected image of the objective lens pupil plane. In the example illustrated, aperture plate 13 has different forms, labelled 13N and 13S, allowing different illumination modes to be selected. The illumination system in the present examples forms an off-axis illumination mode. In the first illumination mode, aperture plate 13N provides off-axis illumination from a direction designated, for the sake of description only, as 'north'. In a second illumination mode, aperture plate 13S is used to provide similar illumination, but from an opposite direction, labelled 'south'. Other modes of illumination are possible by using different apertures. The rest of the pupil plane is desirably dark as any unnecessary radiation outside the desired illumination mode may interfere with the desired measurement signals.

As shown in FIG. 5, target T may be placed with substrate W substantially normal to the optical axis O of objective lens 16. In one example, a ray of illumination I impinging on target T from an angle off the axis 0 gives rise to a zeroth order ray (solid line 0) and two first order rays (dot-chain line +1 and double dot-chain line −1). With an overfilled small target T, these rays are just one of many parallel rays covering the area of the substrate including metrology target T and other features. Since in this example the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitch and illumination angle can be designed or adjusted so that the first order rays entering the objective lens are closely aligned with the central optical axis. The rays illustrated in the example of FIGS. 4 and 5 are shown somewhat off axis, purely to enable them to be more easily distinguished in the diagram.

In this example, at least the 0 and +1 orders diffracted by the target on substrate W are collected by objective lens 16 and directed back through prism 15. Returning to FIG. 4, both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labelled +1 (N), enter the objective lens 16. In contrast, when the second illumination mode is applied using aperture plate 13S the −1 diffracted rays (labelled −1 (S)) are the ones which enter the lens 16. Thus, in an embodiment, measurement results are obtained by measuring the target twice under certain conditions, e.g., after rotating the target or changing the illumination mode or changing the imaging mode to obtain separately the −1 and the +1 diffraction order intensities. Comparing these intensities for a given target provides a measurement of asymmetry in the target, and asymmetry in the target can be used as an indicator of a parameter of a lithography process, e.g., overlay error. In the situation described above, the illumination mode is changed.

A beam splitter 17 divides the diffracted beams into two measurement branches. In a first measurement branch, optical system 18 forms a diffraction spectrum (pupil plane image) of the target on first sensor 19 (e.g., a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam, or for measuring the intensity in the various diffraction orders (e.g., as with DBO metrology). The pupil plane image can also be used for many measurement purposes such as reconstruction, which are not described in detail here.

In this example, in the second measurement branch optical system 20, 22 forms an image of the target on the substrate W on sensor 23 (e.g., a CCD or CMOS sensor). In the second measurement branch, an aperture stop 21 is provided in a plane that is conjugate to the pupil-plane. Aperture stop 21 functions to block the zeroth order diffracted beam so that the image OF of the target formed on sensor 23 is formed from the −1 or +1 first order beam. The images captured by sensors 19 and 23 are output to image processor and controller PU, the function of which will depend on the particular type of measurements being performed. Note that the term 'image' is used here in a broad sense. An image of the periodic structure features (e.g., grating lines) as such will not be formed, if only one of the −1 and +1 orders is present.

The particular forms of aperture plate 13 and stop 21 shown in FIG. 4 are purely exemplary. In another embodiment, on-axis illumination of the targets is used and an aperture stop with an off-axis aperture is used to pass substantially only one first order of diffracted radiation to the sensor. In yet other embodiments, 2nd, 3rd and higher order beams (not shown in FIG. 4) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Note that aperture plate 13N or 13S may be used to measure a periodic structure of a target oriented in one direction (X or Y depending on the set-up). For measurement of an orthogonal periodic structure, rotation of the target through 90° and 270° might be implemented.

Examples of dark field metrology can be found in WIPO Patent Application Publications Nos. 2009/078708 and 2009/106279. Diffraction-based overlay measurement by dark field imaging is also described in US Patent Application Publication No. 2010/0328655. Further developments of the technique have been described in US Patent Application Publication Nos. 2011/0027704, 2011/0043791, 2012/0044470, 2012/0123581, 2013/0258310, and 2013/027140. The contents of all these documents are all hereby incorporated by reference in their entirety. These targets can be smaller than the illumination spot and may be surrounded by product structures on a wafer. Thus, 'composite' targets (e.g., targets including a plurality of individual grating portions of different overlay biases) can be entirely measured in one image. Therefore, the grating edges are also visible in the gray scale images of the target. The grating edges often present intensity levels that deviate from the average grating intensity (referred to herein as 'edge effects'). μDBO requires an extreme contrast ratio. The reason is that even a small signal in the dark area of aperture plate 13N or 13S in FIG. 4 can pass through the aperture 21 and could flood the detector 23, particularly in cases where the intensity in the diffracted order is much smaller than the reflected zero order. It has been discovered that a greater than 1:100,000 contrast ratio is desirable at the illumination pupil for targets with low intensity diffraction orders.

Example Illumination System

An example illumination system 600 suitable for use in a metrology system is shown in FIG. 6. Illumination system 600 includes a first illumination conditioning system 602, a second illumination conditioning system 604, and a third illumination conditioning system 606. First illumination conditioning system 602 provides radiation emitted by a light source (e.g., a broadband source, such as a xenon lamp or broadband laser, or an opening connected to a broadband source). In one embodiment, first illumination conditioning system 602 may select one or more wavelengths or bands of wavelengths and tune broadband radiation to a desired narrow-band wavelength from a broader continuous spectral range. In other embodiments, one or more sources that generate narrow-band radiation are used, alleviating the need for the first illumination conditioning system.

It will be appreciated that the above embodiment can readily be extended to encompass more than one light source to provide additional flexibility. For example, multiple monochromatic light sources may be used instead of a super-continuum laser.

In this example, radiation from First illumination conditioning system 602 is directed via fiber 629 to second illumination conditioning system 604. Second illumination conditioning system 604 includes a spot size selector 631 and condensing lens 612. An aperture plate may be used to determine the spot size of the radiation. In an embodiment, an illumination arrangement of the metrology device is Kohler illumination so that the source size and angular distribution in the back-projected pupil plane at the aperture plate respectively determine the angular distribution of illumination and spot size on the substrate as described in U.S. Pat. App. Pub. No. 2011/0069292, which is incorporated by reference herein in its entirety. With an embodiment of the invention, a small measurement spot may be provided to underfill relatively large targets, e.g. in the scribe line, for accurate measurements whilst a larger spot with a well-defined illumination angle may be provided for measurements of relatively small targets, e.g. in-die markers.

In this example, condensing lens system 612 provides a beam of radiation 634 to third illumination conditioning system 606. Third illumination conditioning system 606 may include a polarizing beam splitting system 635, an illumination mode selector (IMS) 613, and spatial light modulator (SLM) 647. Polarizing beam splitting system 635 splits the incident radiation 634 into at least two sub-beams. For example, polarizing beam splitter (PBS) 637 reflects s-polarization radiation to form first sub-beam 639 and transmits p-polarization to form second sub-beam 640. In the embodiment shown in FIG. 6, polarizing beam splitting system 635 consists of two hexahedron optical slabs, e.g., of fused silica, sandwiching PBS 637. Polarizing beam splitting system 635 may be arranged such that the beams/sub-beam enter and exit the optical slab perpendicular to the optical slab. Alternative beam splitting systems arrangements, however, may be used, such as a beam splitting cube.

In this example, first and second sub-beams 639, 640 are reflected by a plurality of fold mirrors 641 to IMS 613 and SLM 647. Sub-beams 639, 640 may pass through one or more apertures in IMS 613, which "clean up" the spatial profile of first and second sub-beams 639, 640. Depending on the mode selected, first sub-beam 639 or second sub-beam 640 may be blocked by IMS 613. Other modes may allow both sub-beams 639, 640 to pass. In one embodiment, IMS 613 includes a light-absorbent coating to absorb sub-beam light outside a predetermined aperture. SLM 647 may have a similarly-shaped predetermined spatial pattern or "aperture" that reflects a portion of either or both of first and second sub-beams 639, 640 (depending on which sub-beams are transmitted by IMS 613). This is described in further detail below with respect to FIGS. 8A and 8B. SLM 647 alters the polarization state, phase, and/or intensity of each beam in a spatially-resolved manner. In one embodiment SLM 647 may be a reflective liquid crystal array, such as a liquid crystal on silicon (LCOS) array. Pixels of the reflective liquid crystal array may be arranged into reflective states ("on" states) and non-reflective states ("off" states) which define the beam profile. The array may be electronically controlled so as to form a pattern of "on" and "off" pixels. In one embodiment, the "on" pixels may correspond to the aperture portion of the IMS 613, while the "off" pixels surround the "on" pixels. In this way, SLM 647 may perform a diaphragm function to control the spatial profile of the illumination. In an embodiment, the "on" pixels may have the same general shape as an aperture portion of the IMS 613, but with reduced size.

In this example, after reflection from SLM 647, reflected portions of first and second sub-beams 639, 640 may pass again through IMS 613 and back through fold mirrors 641. Fold mirrors 641 in turn may direct each sub-beam back through PBS 637. If SLM 647 has rotated the polarization of each sub-beam, PBS 637 transmits a portion of sub-beam 639 and reflects a portion of sub-beam 640. As a result, the PBS, IMS, and SLM cooperate to control a complex amplitude or intensity spatial profile of at least the first sub-beam or the second sub-beam. The appropriate portions of sub-beams 639, 640 are then reflected by fold mirror 649 to lens relay system 614. Sub-beams 639, 640 are them output to a metrology system as described above.

In one embodiment, birefringent phase plates 651, such as quarter-waveplates, may be placed between PBS 637 and SLM 647 for birefringence compensation. Birefringent phase plates 651 can be used to slightly tweak the polarisation state to enhance contrast of "on" and "off" pixels by compensating for non-zero birefringence in the optical path. In one embodiment, one or more fold mirrors 641 may be actuated to tilt the mirror and function as a sub-beam shutter such that a sub-beam is directed away from optical path of the illumination system to a beam dump.

In the embodiment shown in FIG. 6, IMS 613 is a rotatable aperture wheel. The aperture wheel includes a plurality of apertures arranged in different sectors of the aperture wheel. Each sector corresponds to a different illumination mode. Thus, different illumination modes may be selected by rotating the aperture wheel. Each illumination mode corresponds to a different position of the aperture wheel. An example embodiment of IMS 613 is shown in FIG. 7 and described herein. IMS 613 is mounted on a central rotatable shaft 643, or axle, powered by a motor 645 to rotate IMS 613 into different positions, and hence, different illumination modes. Alternative mechanical embodiments may also be chosen, such a motor-driven linear slider.

An illumination control system 648 that is configured to select a desired illumination mode is communicatively coupled to motor 645. Illumination control system 648 is also communicatively coupled to SLM 642. An illumination control system 648 provides programmable control such that configuration of IMS 613 and SLM 647 complement the selected illumination mode and each other. Though the embodiment described here provides an aperture for each sub-beam, one of skill will appreciate that not every illumination mode requires use of both sub-beams. Likewise, though two sub-beams are described with respect to FIG. 6, one of skill will appreciate that more than two sub-beams may be used.

In the embodiment shown in FIG. 6, IMS 613 and SLM 642 are located in or near an illumination pupil plane, such that IMS 613 and SLM 642 are "stacked" in close proximity. The location of the illumination pupil is determined by the condensing lens system 612. As will be appreciated by one or ordinary skill, the focal length of condensing lens system 612 also determines how near ISM 613 and SLM 642 must be to the illumination pupil plane. In an alternative embodiment, IMS 613 may be located separate from SLM 642, but in a position substantially optically conjugate with a surface of the SLM 642. For example, IMS 613 may be separated from SLM 642 by PBS 637 and/or one or more lens systems.

Stacking, i.e., physically or optically, IMS 613 and SLM 642 creates a high-contrast, programmable illumination pupil. IMS 613, by itself, can provide a high-contrast aperture, but its rigid nature limits adjustability and demands precision positioning. SLM 642, by itself, can provide a programmable illumination pupil, but with considerably lower contrast. Together the combination of IMS 613 and SLM 642 be controlled to define each sub-beam spatial profile, i.e., the edges of the aperture, while IMS 613 provides a "cleaning" of the aperture. This is described in further detail below with respect to FIGS. 8A and 8B. In this way, the combination reduces the precision positioning requirements of the IMS 613, but maintains high contrast (e.g., much greater than 1:2000). In addition, the combined IMS 613 and SLM 642 provides a high extinction ratio (e.g., 1:100,000). An additional benefit of IMS 613 is that it provides a built-in reference check for the contrast of the SML 642. Over the life of SML 642, e.g., a LCOS array, the quality of the "off" states tends to degrade. IMS 613 provides a means to compare the contrast afforded by each element.

FIG. 7 illustrates an exemplary aperture wheel 713 that may be used as an IMS. This exemplary aperture wheel 713 has four illumination modes 720, 730, 740, 750 illustrated. Though four modes are shown, more modes would typically be included. For example, sixteen different modes may be accommodated in a single aperture wheel. In first illumination mode 720 of FIG. 7, aperture plate 713 provides two apertures for a "nonpolarized" measurement, i.e., that includes both s-polarization and p-polarization. In second illumination mode 730, aperture plate 713 provides a single aperture for a p-polarized CD measurement. In third illumination mode 740, aperture plate 713 provides a single aperture for a s-polarized CD measurement. In fourth illumination mode 750, aperture plate 713 provides two-quadrant apertures for a μBDO measurement. The use of these, and numerous other variations and applications of the apparatus are described in, for example, US Patent Application Publication No. 2013/0141730, incorporated herein by reference in its entirety.

FIGS. 8A and 8B illustrate two example configurations of a "stacked" aperture as described above. FIGS. 8A and 8B show the same a two-quadrant aperture that may, for example, be used with a μBDO measurement. Though only a single two-quadrant aperture is shown, one of skill will appreciate that an illumination mode may have more than one two-quadrant aperture, such as with illumination mode 750 described above. FIG. 8A illustrates three contrast areas—high contrast area 860, moderate contrast area 861, and low contrast area 862. High contrast area 860 functions as a "clean-up" aperture as described herein with respect to a IMS. Moderate contrast area 861 corresponds the "off" state of a SLM array and defines the illumination profile as described above. Low contrast area 862 corresponds the "on" state of a SLM array to reflect incident light as described above. In the embodiment shown in FIG. 8A, moderate contrast area 861 (or "off" pixels) may have the same general shape (i.e., a two-quadrant aperture) as high contrast area 860 (or aperture portion of an IMS), but with reduced size, such that only an edge of the effective aperture is provided at moderate contrast. The pattern on the SLM is generated to overlap the IMS aperture. This leads to a transition in signal contrast from about 1:100 to 1:100,000 at the transition from low contrast area 862 to high contrast area 860. As a result, the illumination pupil has low sensitivity to X,Y position accuracy of the mechanical IMS aperture relative to the SLM.

FIG. 8B illustrates how the SLM array in FIG. 8A can be programmed to define an alternative illumination profile where moderate contrast area 861 as a different shape than high contrast area 860. In FIG. 8B, the "on" pixels are arranged into two circular shapes (as opposed to the two-quadrant shape of moderate contrast area 861 in FIG. 8A.

FIG. 9 illustrates an alternative embodiment for a polarizing beam splitting system to be used with the illumination system described herein. Polarizing beam splitting system 935 splits the incident radiation 934 into at least first and second sub-beams 939, 940. As shown in FIG. 9, polarizing beam splitting system 935 may be arranged such that the beams/sub-beam enter and exit the optical slab perpendicular to the optical element. Polarizing beam splitter (PBS) 937 reflects s-polarized radiation to form first sub-beam 939 and transmits p-polarization to form second sub-beam 940. Similar to the description above, first and second sub-beams 939, 940 may be reflected by fold mirrors 941, e.g., reflective films. In the embodiment shown in FIG. 9, polarizing beam splitting system 935 is a monolithic, optical prism with pentagonal cross-section and including PBS 937 and fold mirrors 941. Polarizing beam splitting system 935 may direct the sub-beams via total internal reflection or may optionally include frustrated total internal reflection (FTIR) elements 946. One or both of FTIR elements 946 may function as beam shutters to selectively reflect or transmit a sub-beam as desired according to the illumination mode. For example, FTIR elements 946 may use piezoelectric actuation (e.g., PZT actuators) to optionally create FTIR conditions at the prism surfaces. Thus, polarizing beam splitting system 935 may shutter either of first and second sub-beams 939, 940 and, thereby, improve the polarization extinction ratio. As shown, first sub-beam 939 is permitted to pass through the FTIR element while second sub-beam 940 is reflected by the prism surface. In this way, a single polarized sub-beam can by utilized for illumination, such as in illumination mode 730. One of skill, however, will appreciate that first sub-beam may be utilized, such as in illumination mode 740, or both the first and second sub-beams may be utilized, such as in illumination modes 720, 750.

Example Method of Illumination

FIG. 10 illustrates a flowchart 1000 for using an alignment system to measure the position of a target on a substrate, according to an embodiment. Solely for illustrative purposes, the steps illustrated in FIG. 10 will be described with reference to example operating environments illustrated in FIGS. 6 and 7. However, flowchart 1000 is not limited to these embodiments. It is to be appreciated that steps can be performed in a different order or not performed depending on specific applications. For example, one of skill will appreciate that illumination modes will make use of either or both of the first and second sub-beams. Also, different illumination modes may require different spatial profiles, wavelengths, spot size, etc.

In step 1002, an illumination system generates illumination light. As described above, this may include, for example, wavelength selection and spot size selection.

In step 1004, the illumination is split into a first sub-beam and a second sub-beam. As described above, splitting may be accomplished by a polarization beam splitter (PBS), such as PBS 637. As described above, after splitting the received light into a first sub-beam and a second sub-beam, each beam may be reflected multiple times by fold mirrors and may pass through a birefringent phase plate, such as quarter-waveplate.

In step 1006, the first sub-beam and/or the second sub-beam is transmitted through an aperture of an illumination mode selector (IMS), wherein the IMS is arranged in illumination position corresponding to an illumination mode. As described above, one of the sub-beams may, e.g., be blocked by the IMS or be deflected away by tilting a fold mirror. Some illumination modes, however, will require both sub-beams to be transmitted.

In step 1008, a spatial light modulator (SLM) generates a spatial profile of the transmitted first sub-beam and/or the second sub-beam. For example, the SLM may be a reflective LCOS having a pixel array having a pattern in the shape of the desired spatial profile as described above with respect to FIGS. 8A and 8B. The desired spatial profile is generated by reflecting a portion of the transmitted first and/or second sub-beam to the IMS. The IMS may then "clean up" light that is outside the desired spatial profile as described above.

In step 1010, an objective projection system receives the first sub-beam and/or the second sub-beam by from the IMS and directs the first sub-beam and/or the second sub-beam towards a substrate having a target thereon.

In step 1012, a detector detects an image of the target structure based on radiation from the target. For example, the radiation may be a diffracted image, such as a first order (+1 or −1) radiation as is known in the art. The particulars of this process depend on the illumination mode selected.

In step 1014, the image is analysed and a measurement result is determined based on the illumination mode selected. As described above, the apparatus may determine alignment or overlay error, mark asymmetry, critical dimensions, and/or other process variations using radiation from the target.

Final Remarks

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation," "beam," and "light" used herein encompass all types of electromagnetic radiation, including ultraviolet (UV) radiation (for example, having a wavelength λ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein generally describes a material onto which subsequent material layers are added. In embodiments, the substrate itself may be patterned and materials added on top of it may also be patterned, or may remain without patterning.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

What is claimed is:

1. A metrology system, comprising:
   a polarizing beam splitter (PBS) configured to divide an illumination beam into a first sub-beam and a second sub-beam;
   an illumination mode selector (IMS) having a plurality of apertures, each aperture configured to transmit either the first sub-beam or the second sub-beam and the IMS being configured to be arranged in a plurality of illumination positions, each of the plurality of illumination positions corresponding to an illumination mode;
   a reflective spatial light modulator (SLM) having a pixel array, the pixel array being configured to modify a spatially-resolved beam characteristic of the first sub-beam and the second sub-beam and to reflect either or both of the first sub-beam and the second sub-beam back to the IMS and PBS along a return path, wherein, along the return path, the PBS, IMS, and SLM cooperate to control a complex amplitude or intensity spatial profile of at least the first sub-beam or the second sub-beam;
   an objective projection system configured to receive the first sub-beam and the second sub-beam from the IMS and PBS and direct the first sub-beam and the second sub-beams towards a substrate having a target structure thereon; and
   a detector configured to receive an image or diffracted image of the target structure.

2. The metrology system of claim 1, wherein the reflective SLM is positioned in or near an illumination pupil plane.

3. The metrology system of claim 2, wherein the IMS is positioned in or near the illumination pupil plane.

4. The metrology system of claim 2, wherein the IMS is positioned in or near a plane substantially optical conjugate to the illumination pupil plane.

5. The metrology system of claim 1, wherein the reflective SLM and IMS are arranged such that at least one of the plurality of apertures of the IMS overlaps a corresponding spatial profile pattern on the reflective SLM.

6. The metrology system of claim 1, wherein the PBS is sandwiched between two hexahedron optical prisms.

7. The metrology system of claim 1, wherein the PBS is sandwiched between two optical prisms forming a beam splitting cube.

8. The metrology system of claim 1, wherein the PBS is incorporated into a monolithic optical prism.

9. The metrology system of claim 8, further comprising a frustrated total internal reflection (FTIR) element at a surface of the monolithic optical prism, the FTIR element configured to shutter the first sub-beam or the second sub-beam.

10. The metrology system of claim 1, further comprising a controller configured to set the illumination mode by positioning the IMS in a desired position and generating a corresponding spatial profile pattern on the reflective SLM.

11. The metrology system of claim 10, wherein the plurality of apertures of the IMS have predefined shape and the corresponding spatial profile pattern has the same general shape as the predefined shape of the plurality of apertures of the IMS.

12. The metrology system of claim 10, wherein the plurality of apertures of the IMS have predefined shape and the corresponding spatial profile pattern has a different general shape than the predefined shape of the plurality of apertures of the IMS.

13. The metrology system of claim 1, wherein the illumination mode is a critical dimension measurement mode.

14. The metrology system of claim 1, wherein the illumination mode is a micro-diffraction-based overlay (µDBO) measurement mode.

15. A method for inspection comprising:
    splitting, via a polarizing beam splitter (PBS), an illumination beam into a first sub-beam and a second sub-beam;
    transmitting either the first sub-beam or the second sub-beam through an aperture of illumination mode selector (IMS), wherein the IMS is arranged in an illumination position corresponding to an illumination mode;
    generating a desired a complex amplitude or intensity spatial profile of the transmitted first sub-beam or the second sub-beam via a reflective spatial light modulator (SLM) having a pixel array by reflecting a portion of the transmitted first or second sub-beam to the IMS and the PBS;
    directing, via an objective projection system, the portion of the transmitted first sub-beam or second sub-beam from the IMS and PBS towards a substrate having a target thereon; and
    detecting an image or diffracted image of the target structure.

16. The method of claim 15, further comprising positioning the reflective SLM in or near an illumination pupil plane.

17. The method of claim 16, further comprising positioning the IMS in or near the illumination pupil plane.

18. The method of claim 16, further comprising positioning the IMS in or near a plane substantially optical conjugate to the illumination pupil plane.

19. The method of claim 15, further comprising arranging the reflective SLM and IMS so that the aperture of the IMS overlaps a corresponding spatial profile pattern on the reflective SLM.

20. The method of claim 15, further comprising:
    positioning the IMS in a desired position to set the illumination mode; and
    generating a corresponding spatial profile pattern on the reflective SLM.

21. The method of claim 15, wherein generating the desired spatial profile of the transmitted first sub-beam or the second sub-beam generates a spatial profile pattern that has the same general shape as a predefined shape of the aperture of the IMS.

22. The method of claim 15, wherein generating the desired spatial profile of the transmitted first sub-beam or the second sub-beam generates a spatial profile pattern that has a different general shape than a predefined shape of the aperture of the IMS.

23. The method of claim 15, further comprising using a critical dimension measurement mode as the illumination.

24. The method of claim 15, further comprising using a micro-diffraction-based overlay (µDBO) measurement mode as the illumination mode.

* * * * *